(12) United States Patent
Heyman et al.

(10) Patent No.: US 10,587,070 B2
(45) Date of Patent: Mar. 10, 2020

(54) DOUBLE SHEAR WELD JOINT FOR ELECTRONIC ENCLOSURE

(71) Applicant: APPLE INC., Cupertino, CA (US)

(72) Inventors: Ross C. Heyman, Belmont, CA (US); Cesar Lozano Villarreal, Campbell, CA (US); Johnathan D. Simeroth, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/174,219

(22) Filed: Oct. 29, 2018

(65) Prior Publication Data

US 2019/0372265 A1  Dec. 5, 2019

Related U.S. Application Data

(60) Provisional application No. 62/763,139, filed on Sep. 10, 2018, provisional application No. 62/678,692, filed on May 31, 2018.

(51) Int. Cl.
```
H01R 13/506    (2006.01)
H01R 43/20     (2006.01)
H01R 13/66     (2006.01)
```
(52) U.S. Cl.
CPC ....... *H01R 13/506* (2013.01); *H01R 13/6675* (2013.01); *H01R 43/20* (2013.01)

(58) Field of Classification Search
CPC .. H01R 13/46; H01R 13/502; H01R 13/5025; H01R 13/504; H01R 13/5045; H01R 13/506; H01R 13/665; H01R 13/6675; H01R 43/20; B29C 66/71; H05K 5/0052; H05K 5/0008; H05K 5/0004

USPC ....... 220/3.8, 3.9, 3.92, 3.94, 4.02; 174/559–563

See application file for complete search history.

(56) References Cited

U.S. PATENT DOCUMENTS 5,681,409 A * 10/1997 Lin ............ B29C 65/08
                                        156/73.1
5,863,364 A * 1/1999 Lin ............ B29C 65/08
                                        156/73.1

(Continued)

FOREIGN PATENT DOCUMENTS

AU    2018101461    10/2018
EP    2822014 A1    1/2015

(Continued)

OTHER PUBLICATIONS

First Examination Report issued in Australia Application No. AU2018101461, dated Dec. 7, 2018 in 4 pages.

(Continued)

*Primary Examiner* — Oscar C Jimenez
(74) *Attorney, Agent, or Firm* — Kilpatrick Townsend and Stockton, LLP

(57) ABSTRACT

An enclosure for an electronic device includes a housing having a wall defining a cavity that is configured to receive an electronic assembly therein. The wall includes a distal end having a tongue. A cap is sized to attach to the housing with a corresponding groove that is formed in a perimeter of the cap. A double shear weld joint is formed between the tongue and the groove such that flash from the weld is contained within the enclosure and is not visible on the exterior surface of the enclosure.

20 Claims, 7 Drawing Sheets

(56) References Cited

U.S. PATENT DOCUMENTS

| | | | | |
|---|---|---|---|---|
| 5,967,807 | A * | 10/1999 | Wu | H01R 29/00 |
| | | | | 439/131 |
| 7,212,420 | B2 * | 5/2007 | Liao | H01R 13/6675 |
| | | | | 363/146 |
| 7,744,381 | B2 * | 6/2010 | Honda | H05K 5/0052 |
| | | | | 439/79 |
| 7,767,920 | B1 | 8/2010 | Matsuhashi | H01H 11/00 |
| | | | | 200/61.88 |
| 7,789,696 | B2 * | 9/2010 | Umei | H05K 5/0247 |
| | | | | 439/447 |
| 8,226,424 | B1 * | 7/2012 | Wang | H01R 13/2421 |
| | | | | 439/172 |
| 8,337,250 | B1 * | 12/2012 | Yang | H01R 13/112 |
| | | | | 439/620.22 |
| 8,942,001 | B2 * | 1/2015 | Kawai | H05K 5/0052 |
| | | | | 361/752 |
| 2002/0136856 | A1 * | 9/2002 | Sugimura | B29C 66/1312 |
| | | | | 428/60 |
| 2002/0148427 | A1 * | 10/2002 | Jones | B29C 66/1142 |
| | | | | 123/184.61 |
| 2004/0094551 | A1 * | 5/2004 | Mavin | B29C 65/5057 |
| | | | | 220/258.2 |
| 2005/0153588 | A1 * | 7/2005 | Liao | H01R 31/06 |
| | | | | 439/172 |
| 2006/0133086 | A1 * | 6/2006 | Bouteiller | B29C 65/16 |
| | | | | 362/268 |
| 2009/0209133 | A1 * | 8/2009 | Nogami | H01R 13/6658 |
| | | | | 439/620.01 |
| 2015/0093924 | A1 | 4/2015 | Villarreal et al. | |
| 2015/0311656 | A1 * | 10/2015 | Lai | H01R 31/065 |
| | | | | 439/620.22 |
| 2016/0043497 | A1 * | 2/2016 | Wang | H01R 13/5202 |
| | | | | 439/620.21 |
| 2017/0045068 | A1 * | 2/2017 | Sikorski | F16L 13/103 |
| 2017/0093077 | A1 | 3/2017 | Kwan et al. | |
| 2019/0081431 | A1 * | 3/2019 | Heyman | H01R 13/504 |

FOREIGN PATENT DOCUMENTS

| | | |
|---|---|---|
| JP | 2000135740 A | 5/2000 |
| JP | 2000299568 A | 10/2000 |
| TW | M492552 U | 12/2014 |
| TW | M544183 U | 6/2017 |

OTHER PUBLICATIONS

U.S. Application filed May 8, 2018, entitled Electronic Device Enclosures Having a Monolithic Appearance and assigned U.S. Appl. No. 15/974,185.

U.S. Application filed Sep. 10, 2018, entitled Ultrasonic Weld Joint With Integral Flash Trap and assigned U.S. Appl. No. 16/126,989.

Extended European Search Report issued in European Application No. EP18196977.5, dated Jul. 16, 2019 in 10 pages.

Office Action issued in Japan Application No. JP2018-180666, dated Nov. 8, 2019 in 4 pages.

Office Action issued in Taiwan Application No. TW107134302, dated Nov. 20, 2019 in 16 pages.

* cited by examiner

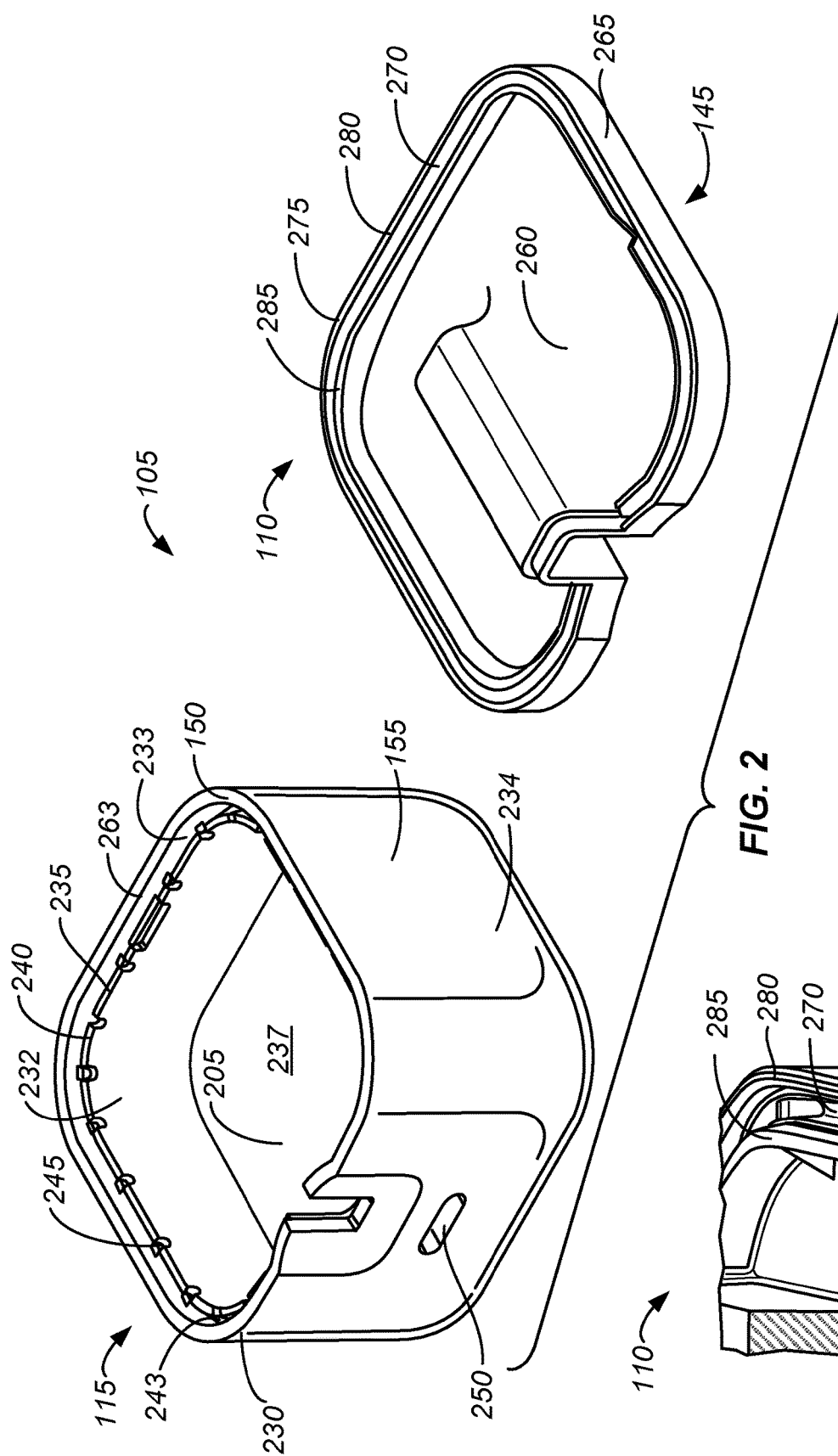
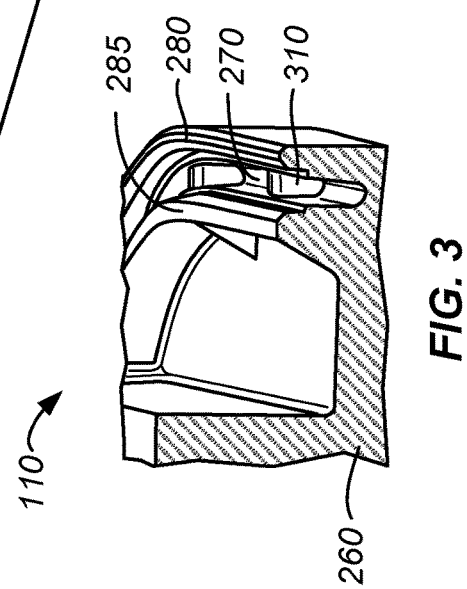
FIG. 2
FIG. 3

DOUBLE SHEAR WELD JOINT FOR ELECTRONIC ENCLOSURE

CROSS-REFERENCES TO OTHER APPLICATIONS

This application claims priority to U.S. provisional patent application Ser. No. 62/678,692, for "DOUBLE SHEAR WELD JOINT FOR ELECTRONIC ENCLOSURES" filed on May 31, 2018 and to U.S. patent application Ser. No. 62/763,139 filed on Sep. 10, 2018 for "DOUBLE SHEAR WELD JOINT FOR ELECTRONIC ENCLOSURES, which are hereby incorporated by reference in entirety for all purposes.

FIELD

The described embodiments relate generally to plastic enclosures that are made of two or more plastic components. More particularly, the present embodiments relate to plastic enclosures that house one or more electronics assemblies and include weld joints that are not visible from the exterior and that do not have visible exterior weld flash at the weld joints.

BACKGROUND

Currently there are a wide variety of electronic devices that have external enclosures to facilitate the use of the electronic device and provide an aesthetic appearance. However, often such enclosures have one or more seams where the plastic components of the enclosure are joined together. The external appearance of the seams can be difficult to uniformly control during high volume production. The seams can also be relatively weak regions of the enclosure that are prone to damage and/or separation. This can be particularly problematic for enclosures that contain high-voltage electronic components that would be exposed if seam were broken or separated. New enclosures and new methods for joining enclosure components are needed so the enclosure seams are more uniform during production, are aesthetically pleasing and have improved structural integrity.

SUMMARY

Some embodiments of the present disclosure relate to enclosures for electronic devices. Various embodiments relate to plastic enclosures that are made from two or more components that are joined together with welded seams. One component can have a tongue and the other component can have a corresponding groove that are welded together to form a double shear weld joint. The flash from the weld can be contained entirely within the enclosure so the enclosure can have an aesthetically appealing exterior.

In some embodiments an enclosure for an electronic device comprises a housing including a bottom wall and at least one sidewall extending from the bottom wall to define a cavity wherein the at least one sidewall has a distal end region. A tongue forms a portion of the distal end region and includes a plurality of segments distributed along a length of the tongue with adjacent segments of the plurality of segments separated by a gap. A cover is attached to the distal end region of the housing, the cover including a pair of parallel walls positioned along a perimeter region of the cover, the pair of parallel walls defining a groove therebetween, wherein the tongue is aligned with and positioned within the groove. A plurality of supports are disposed within the groove and extend between the pair of parallel walls, wherein each of the plurality of supports is aligned with a corresponding gap.

In some embodiments the tongue is welded to the pair of parallel walls, forming a double shear weld joint. In various embodiments the enclosure further comprises a plurality of electrical prongs that extend from the cover and are configured to mate with a corresponding receptacle connector. In some embodiments the enclosure further comprises an electronic assembly positioned within the cavity. In various embodiments the electronic assembly is an AC to DC converter that converts AC power received from the corresponding receptacle connector to DC power that is supplied to an external electronic device.

In some embodiments the enclosure further comprises a receiving opening formed in the enclosure that enables the external electronic device to be electrically coupled to the electronic assembly. In various embodiments the enclosure further comprises a peripheral wall forming a portion of the distal end region, wherein the peripheral wall is parallel to and spaced apart from the tongue.

In some embodiments a plastic assembly comprises a first plastic component including at least one wall having a distal end region. A tongue forms a portion of the distal end region, the tongue including a plurality of segments distributed along a length of the tongue with adjacent segments of the plurality of segments separated by a gap. A second plastic component is attached to the distal end region of the first plastic component, the second plastic component including a pair of parallel walls defining a groove between the pair of parallel walls, wherein the tongue is aligned with and positioned within the groove. A plurality of supports are disposed within the groove and extend between the pair of parallel walls, wherein each of the plurality of supports is aligned with a corresponding gap.

In some embodiments the first plastic component includes a bottom wall and the at least one wall extends from the bottom wall to define a cavity. In various embodiments the plastic assembly further comprises an electronic assembly positioned within the cavity. In some embodiments the electronic assembly is an AC to DC converter that converts AC power received from a corresponding receptacle connector to DC power that is supplied to an external electronic device. In various embodiments the plastic assembly further comprises a receiving opening positioned at an exterior surface that enables a connector of the external electronic device to be electrically coupled to the electronic assembly.

In some embodiments the second plastic component is a cover and the pair of parallel walls are positioned along a perimeter region of the cover. In various embodiments the plastic assembly further comprises a plurality of electrical prongs extending from the second plastic component and are configured to mate with a corresponding receptacle connector. In some embodiments the tongue is welded to the pair of parallel walls, forming a double shear weld joint.

In some embodiments a method of forming an electronic device comprises forming a housing including a bottom wall and at least one sidewall extending from the bottom wall to define a cavity. The at least one sidewall includes a tongue that forms a portion of a distal end region of the at least one sidewall, wherein the tongue includes a plurality of segments distributed along a length of the tongue with adjacent segments of the plurality of segments separated by a gap. The method further includes disposing an electronic assembly within the cavity and forming a cover including a pair of parallel walls positioned along a perimeter region of the cover, the pair of parallel walls defining a groove therebetween, the cover further including a plurality of supports disposed within the groove and extending between the pair of parallel walls. The method further includes aligning the cover at the distal end region of the housing such that the tongue is aligned with and positioned within the groove and each of the plurality of supports is aligned with a corresponding gap, and attaching the tongue to the pair of parallel walls.

In some embodiments the tongue is attached to the pair of parallel walls with a double shear weld joint. In various embodiments the housing includes a receiving opening configured to receive a connector of an external electronic device. In some embodiments the electronic assembly is an AC to DC converter that converts AC power received from a wall receptacle to DC power that is supplied to the external electronic device through the connector. In various embodiments the electronic device includes a plurality of electrical prongs extending from an exterior surface.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIG. 2 is a partial exploded view of the enclosure shown in FIG. 1;

FIG. 3 is a partial perspective cross-sectional view of the cover shown in FIGS. 1 and 2;

DETAILED DESCRIPTION

Some embodiments of this disclosure are directed to electronic enclosures that have two or more plastic components joined together at a seam or joint formed between the components. While the present disclosure can be useful for a wide variety of configurations, some embodiments of the disclosure are particularly useful for electronic enclosures that have an aesthetically appealing exterior surface and/or that enclose high voltage electronic assemblies that would be dangerous to a user if the enclosure separated, as described in more detail below.

For example, in some embodiments joining of the two or more plastic components can be performed with a process known in the art as ultrasonic welding. In various embodiments the joint is formed using an ultrasonically welded configuration where a tongue of a first plastic component is welded to a groove within a second plastic component such that the entire weld joint and any associated weld residue, also called "flash" herein, is hidden within the enclosure.

In some embodiments the tongue is welded to both sides of the groove, forming a "double shear" weld joint. The double shear weld joint balances applied forces during welding so stresses and deformation are equally distributed on each side of the tongue. As a result, the double shear joint can result in less distortion of the cover and housing during joining, may require less fixturing to keep the cover and housing from distorting during the joining process and may also form a stronger joint than a comparable single sided shear joint, making the enclosure stronger which can be useful for protecting electronic assemblies that operate at high voltages and/or currents. Further, since the double shear joint more evenly distributes stresses, the welding process can be more consistently controlled during high volume manufacturing resulting in a more consistent aesthetic appearance. These features and others will be described in more detail herein.

In order to better appreciate the features and aspects of plastic enclosures having a tongue and groove double shear weld joint according to the present disclosure, further context for the disclosure is provided in the following section by discussing one particular implementation of an electronic enclosure according to embodiments of the present disclosure. These embodiments are for example only and other embodiments can be employed in other electronic devices such as, but not limited to wireless routers, wireless television devices, computers, watches, media players and other devices.

Figure 1:
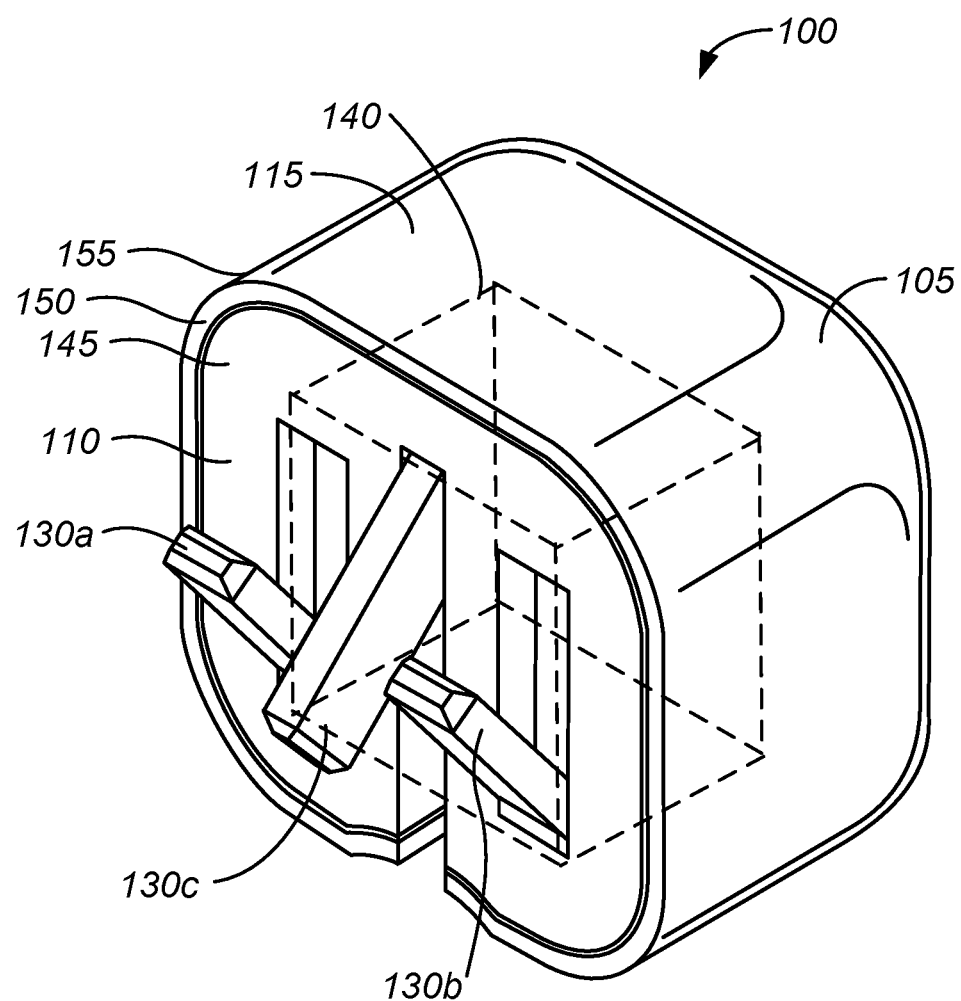
FIG. 1 is a front perspective view of an electronic device having an enclosure, according to some embodiments of the disclosure.

FIG. 1 illustrates a simplified perspective view of an electronic device 100 comprising an AC to DC adapter having an enclosure 105. As shown in FIG. 1, enclosure 105 can include a cover 110 positioned at least partially within and secured to a housing 115 with a tongue and groove double shear weld joint, as described in more detail below.

In some embodiments the double shear weld joint can be used to enable an outer surface 145 of cover 110 to be substantially coplanar with top surface 150 of at least one sidewall 155 of housing, so that enclosure has an aesthetic look and feel. In some embodiments one or more double shear joints are formed between cover 110 and housing 115, as described in more detail below.

Cover 110 has three retractable electrical prongs 130a, 130b, 130c that extend away from the cover and are configured to be plugged into an AC wall outlet to receive AC power. In the embodiment illustrated in FIG. 1, electrical prongs 130a, 130b, 130c are retractable and are shown in a partially retracted position. When fully retracted each electrical prong 130a, 130b, 130c will be positioned within corresponding pockets, 133a, 133b, 133c. When fully deployed, each electrical prong 130a, 130b, 130c will extend substantially perpendicular to outer surface 145 of cover 110 such that the electrical prongs can be mated with a corresponding wall receptacle connector. Although three electrical prongs 130a, 130b, 130c illustrated in FIG. 1 are compatible with selected United Kingdom receptacle wall receptacle connectors, in other embodiments a different configuration of and/or number of prongs can be used that are compatible with other receptacle standards such as, but not limited to, United States, Japan and China.

In some embodiments, enclosure 105 encases an AC to DC electronics assembly 140 that can receive electrical power (e.g., 120 Volts AC) electrical prongs 130a, 130b, 130c when the three electrical prongs are engaged with a wall receptacle. Electronics assembly 140 can be configured to transform the AC power received from the receptacle connector to DC power (e.g., 5 Volts DC) that can be supplied to an electronic computing device through a mating connector inserted in a receiving opening (not shown in FIG. 1), as described in more detail below.

FIG. 2 illustrates a partial perspective view of housing 115 removed from cover 110. In some embodiments housing 115 includes a bottom wall 205 and at least one sidewall 155 extending from the bottom wall, the at least one sidewall having a distal end region 230. Distal end region 230 includes a tongue 235 that extends away from bottom wall 205 and can be formed from a portion of interior surface 232 of at least one sidewall 155. In some embodiments tongue 235 is formed in-between interior surface 232 and exterior surface 234 while in some embodiments the tongue is formed from a portion of exterior surface 234. In some embodiments tongue 235 can be segmented, having a gap 245 disposed between each adjacent segment, as discussed in more detail below. Distal end region 230 can also include a peripheral wall 233 positioned parallel to and spaced apart from tongue 235 and formed from a portion of an exterior surface 234 of at least one sidewall 155 such that a channel 243 is defined between the tongue and the peripheral wall. Bottom wall 205 and at least one sidewall 155 can form a cavity 237 having an opening 240 positioned opposite the bottom wall and sized to receive electronic assembly 140 (see FIG. 1). A receiving opening 250 formed in at least one sidewall 155 is configured to receive a mating connector that can couple DC energy from electronic assembly 140 (see FIG. 1) to an external electronic device.

FIG. 2 also illustrates cover 110 that can include a top wall 260 and a perimeter edge 265 extending from the top wall to form a perimeter of the cover that is sized to fit within aperture 263 of enclosure 105. More specifically, in some embodiments cover 110 is configured to fit within a portion of housing 115 such that outer surface 145 of cover 110 is substantially coplanar with top surface 150 of at least one sidewall 155 of housing, so that enclosure has an aesthetic look and feel. A groove 270 can be formed around a perimeter region 275 of cover 110 and can be sized to receive and be joined to tongue 235 of housing 115 using ultrasonic welding, adhesive, solvent or other process. Groove 270 can be formed from a first wall 280 that is formed from perimeter edge and extends around perimeter region, and from a second wall 285 that is positioned parallel to the first wall and spaced apart from the first wall by a width of the groove.

FIG. 3 illustrates a close-up perspective view of groove 270 formed in cover 110. In some embodiments one or more supports 310 can be formed within groove 270 that adjoin first and second walls 280, 285, respectively, of the groove together. During formation of the double shear joint welding groove 270 to tongue 235, supports 310 can be used to keep first and second walls 280, 285, respectively, from bending outward, away from tongue 235. The location of supports 310 can be optimized to minimize distortion of first and second walls 280, 285, respectively, so minimal fixturing is required to hold the first and second walls in place during welding. In some embodiments, supports 310 align with gaps 245 formed in tongue 235 to provide clearance for the supports so the energy from the welding process is focused only on the double shear joint. Gaps 245 can also be used to allow air and/or flash to escape during the welding process. More specifically, as the double shear joint is formed and tongue 235 slides into groove 270, the air volume within the tongue and groove joint decreases and is allowed to escape through the one or more gaps.

Figure 4:
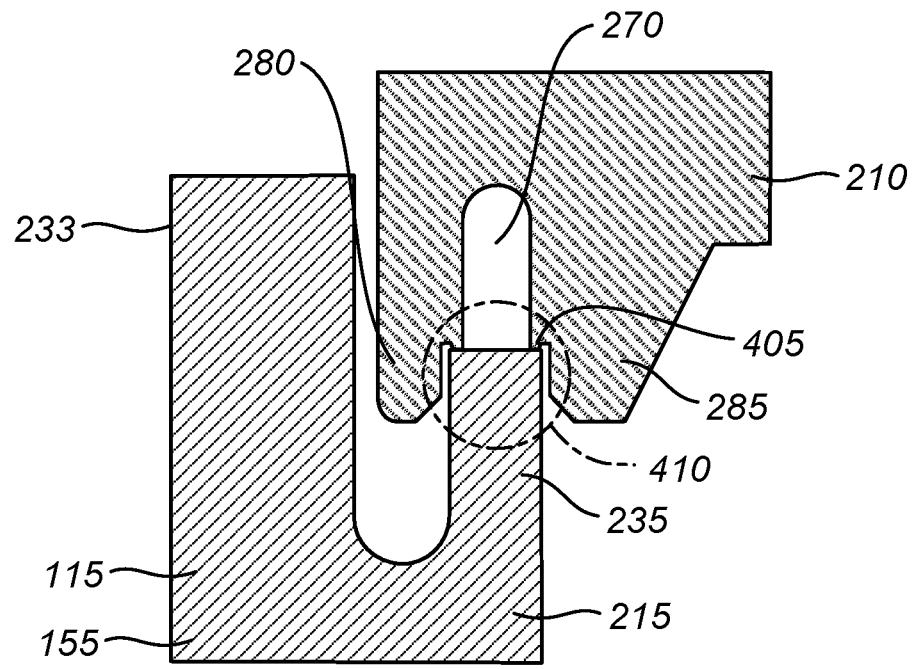
FIG. 4 is a partial cross-sectional view of an interface between the housing and the cover of the enclosure shown in FIGS. 1-3, before a welding process.
Figure 5:
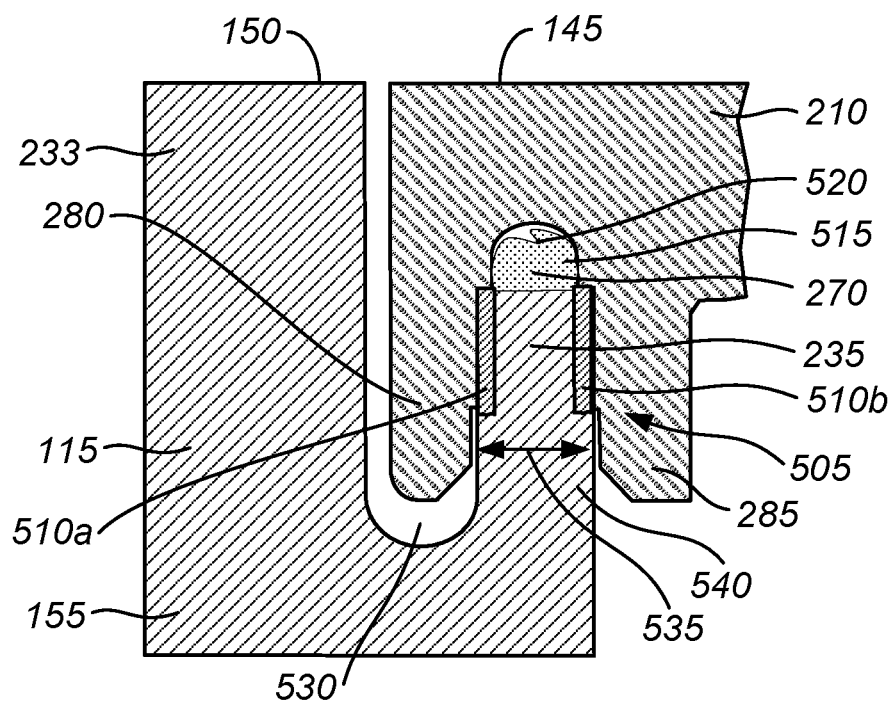
FIG. 5 is a partial cross-sectional view of the interface shown in FIG. 4 after the welding process.

FIGS. 4 and 5 illustrate close-up partial cross-sectional view of the interface between cover 110 and housing 115 before and after the weld joint formation, respectively. As shown in FIG. 4 cover 210 includes groove 270 that is aligned with tongue 235 of housing 215. In some embodiments groove 270 can have an alignment portion 410 that has a clearance fit for tongue 235 so the tongue aligns with the groove before the weld joint is formed. In various embodiments the clearance between tongue 235 and either side of groove 270 is between 2 and 5 microns. In some embodiments cover 210 can include one or more weld initiation points 405 that are the first portion of cover 210 to be in physical contact with tongue 235.

As shown in FIG. 5, a double shear weld joint 505 has been formed between cover 110 and housing 115 using ultrasonic welding. Ultrasonic welding involves applying high frequency (e.g., in the range of 10 kHz to 40 kHz) acoustic vibrations to cover 110 and housing 115 while the two components are held together under pressure to create a solid-state weld. Force can be applied to cover 110 and housing 115 to push them together during the welding process. The vibrations cause heat to be generated at the interfaces where cover 110 and housing 115 are in contact with each other as a result of the friction between the surfaces. The heat causes localized regions of cover 110 and housing 115 to melt and form the weld joints. At each of the weld joints flash is generated that is extruded out of the welds.

As further shown in FIG. 5, during the welding process, cover 110 has moved towards and into housing 115 such that an outer surface 145 of cover 110 is substantially coplanar with top surface 150 of at least one sidewall 155 of housing, so that enclosure has an aesthetic look and feel. In some embodiments the co-planarity of outer surface 145 and top surface 150 is between 2 microns and 100 microns, while in various embodiments it is between 4 microns and 20 microns and in one embodiment is 5 microns or less.

The use of double shear weld joint 505 can enable a high cosmetic quality level of enclosure 105 while also providing a strong and reliable interface to protect against exposure of high voltage circuitry within the enclosure. More specifically, the double shear weld joint 505 can enable better control of the co-planarity of outer surface 145 with top surface 150, and better strength than other types of weld joints that may require a larger melt volume and/or increased welding time to achieve a similar strength as the double shear joint.

Double shear weld joint 505 includes a first weld joint 510a formed between tongue 235 and first wall 280 and a second weld joint 510b formed between the tongue and second wall 285. Weld flash 515 has collected in a bottom portion 520 of groove 270. First wall 280 fits within a channel 530 positioned between peripheral wall 233 and tongue 235. During welding air has escaped from groove 270 through gaps 245 (see FIG. 2). Since weld flash 515 collects in bottom portion 520 of groove 270 which is positioned within enclosure 105, no weld flash is visible on the exterior of the enclosure, providing an aesthetic appearance.

In some embodiments a combined width of first and second weld joints 510a, 510b, respectively, is designed to be larger than a width 535 of tongue base 540. In various embodiments width 535 of tongue base 540 can be selected so that when enclosure 105 is subjected to mechanical stress, the tongue base fails before first and second weld joints 510a, 510b, respectively. In some embodiments, a mechanical strength of tongue base 540 can be more accurately predicted than a mechanical strength of first and second weld joints 510a, 510b, respectively, because the tongue base is a homogeneous material that is undisturbed during the welding process, whereas the first and second weld joints are formed from a mixture of groove 270 and tongue 235 material.

Figure 6:
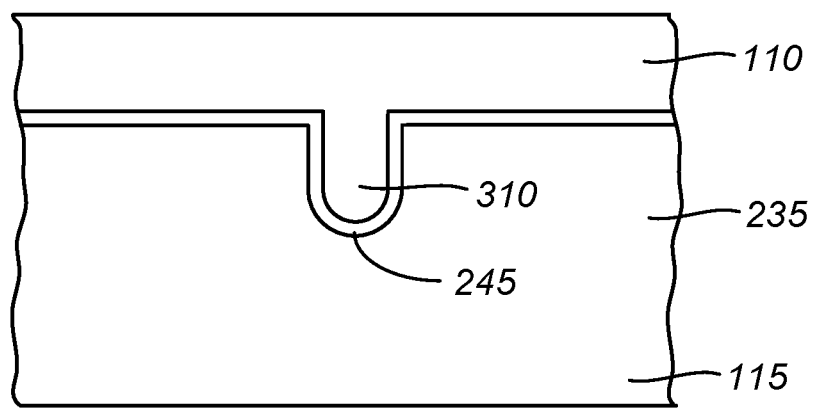
FIG. 6 is a partial cross-sectional view of a portion of the cover and the housing shown in FIGS. 1-5 in the region of a support and a gap.
Figure 7:
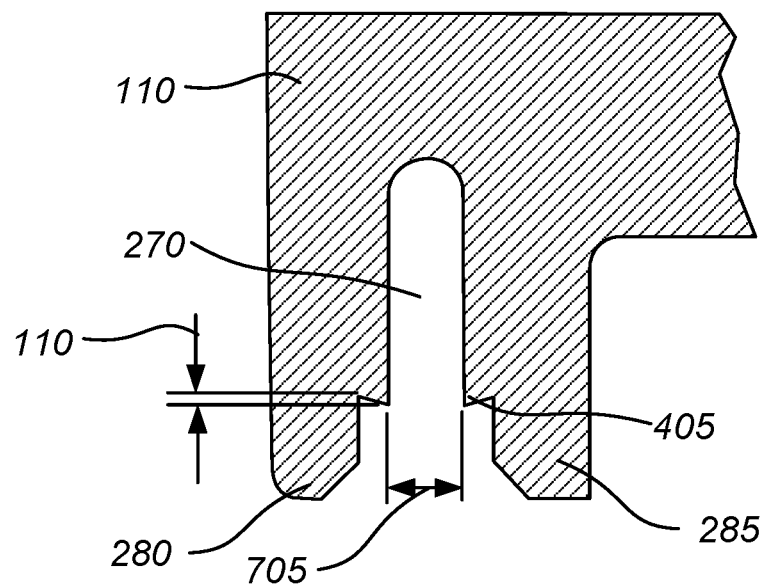
FIG. 7 is a partial cross-sectional view of a portion of the cover shown in FIGS. 1-5 in the region of the groove.

FIG. 6 illustrates a simplified partial cross-sectional view of enclosure 105 in the region of a support 310. As shown in FIG. 7, a segmented tongue 235 includes gaps 245 positioned between each adjacent segment, and support 310 is positioned within the corresponding gap. As shown, a clearance is formed between support 310 and gap 245 which allows air to escape during the formation of double shear weld joint 505 (see FIG. 5). In one embodiment support 310 is between 0.5 millimeters and 0.7 millimeters wide and a clearance between 0.2 millimeters and 0.4 millimeters is formed between the gap and the support.

FIG. 7 illustrates a close-up partial cross-sectional view of groove 270 formed in cover 110. As shown in FIG. 7, groove 270 can include one or more weld initiation points 405 that are the first portion of cover 110 to be in physical contact with tongue 235 (see FIG. 4). In some embodiments a groove width 705 can be between 0.2 and 0.7 millimeters and in various embodiments between 0.4 and 0.6 millimeters and in one embodiments is approximately 0.55 millimeters. Other embodiments can have different dimensions. In further embodiments the groove can be formed in the housing and the tongue can be formed on the cap, as described in more detail below.

Figure 8:
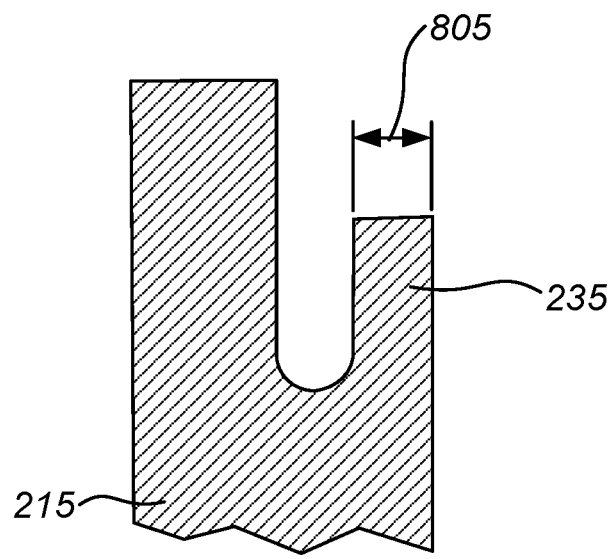
FIG. 8 is a partial cross-sectional view of a portion of the housing shown in FIGS. 1-5 in the region of the tongue.

FIG. 8 illustrates a close-up partial cross-sectional view of tongue 235 formed as a portion of housing 115. As shown in FIG. 8, tongue 235 can have a tongue width 805 between 0.5 millimeters and 1.0 millimeters and in some embodiments is between 0.7 millimeters and 0.9 millimeters and in one embodiment is approximately 0.80 millimeters. Other embodiments can have different dimensions.

As discussed above the embodiment of FIGS. 1-8 includes a housing 115 with a tongue 235 and a cover 110 with a groove 270. However, other embodiments can have a housing with a groove and a cover with a tongue. The features of the double shear weld joint disclosed herein are not restricted to being disposed on one component or the other. Further, in some embodiments cover 110 includes one or more walls that extend to create a chamber, wherein the one or more walls have a distal end that includes either a tongue or a groove weld feature. The embodiments disclosed herein can be applied to myriad enclosures.

Figure 9:
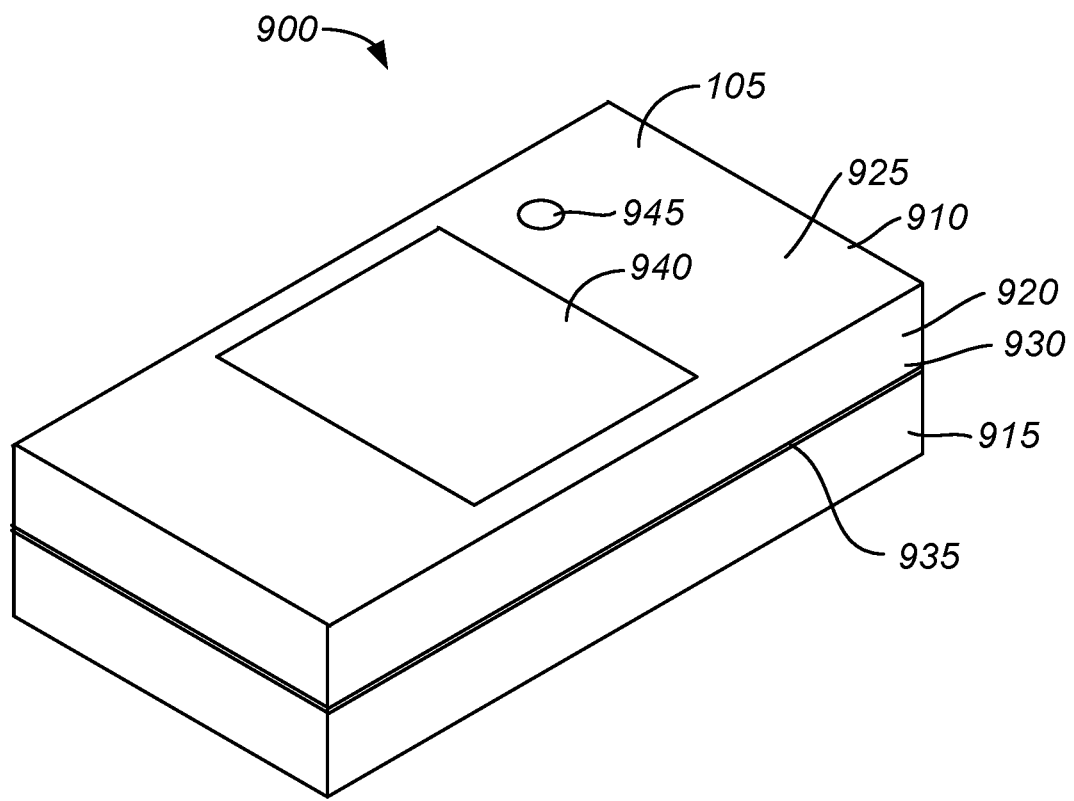
FIG. 9 is top perspective view of an electronic device having an enclosure, according to some embodiments of the disclosure.

For example, FIG. 9 illustrates a simplified perspective view of an electronic device 900, that can be used, for example, as an underwater diving device according to some embodiments of the disclosure. Electronic device 900 can include an enclosure 905 that is made from a cover 910 joined to a housing 915 with a double shear weld joint similar to that illustrated in FIGS. 1-8, however in this embodiment cover 910 includes one or more walls 920 that extend from a top wall 925 to create a chamber therein. At a distal end 930 of the one or more walls 920 either a tongue or a groove feature is formed, as illustrated above in FIGS. 1-8.

The double shear weld joint can result in less distortion of cover 910 and housing 915 and can exhibit improved strength as compared to other joints. The double shear weld joint can also result in less distortion of cover 910 and housing 915 as compared to other weld joints. In some embodiments a cosmetic gap 935 can be formed housing 915 and cover 910.

Enclosure 905 is illustrated as including a display 940 (e.g., a touch display) and an input button 945 however other embodiments can have different user interface features. Since enclosure 905 can, in some embodiments, completely encompass the electronics assembly the electronic assembly within the enclosure can be inductively charged with a separate inductive charging station such that no penetrations are required through enclosure 905 making it liquid-tight. In further embodiments enclosure 905 can have a battery or other power source within it. Embodiments of the disclosure are not limited to any particular electronic device. In some embodiments enclosure 905 can be used for electronic devices that have different components and/or features than those shown or described in FIG. 9.

For example, in some embodiments enclosure 905 can be used to enclose electronics assemblies such as, but not limited to, a smartphone, a tablet computer, a laptop or other type of computer, a watch, a wireless communication transceiver, a wireless router, an RFID device or a wirelessly activated tag for locating lost keys. In one example, enclosure 905 can be used to encase a wireless transceiver, a rechargeable battery and a wireless charging interface to charge an internal battery. The enclosure can be formed without penetrations through the enclosure so the internal electronic assembly is fully encased and protected from water, moisture, dust or other environmental contaminants. In further embodiments, enclosure 905 can be used for purposes other than enclosing an electronic device. In one example, enclosure 905 can be used to form an aesthetically appealing enclosure for an antique (e.g., a coin or a piece of ancient artwork) that needs to be protected from damage and/or exposure to the environment.

As defined herein, liquid-tight shall mean a seal that conforms to one or more of the following ratings as defined by the International Protection Rating and International Electrotechnical Commission (IEC) 60529 that can also be known as the I.P. 68 rating. In some embodiments the liquid-tight seal will protect the electronic assembly against the harmful ingress of water and have a "liquid ingress" rating between 1 (dripping water) and 8 (immersion beyond 1 meter). In various embodiments the liquid-tight seal shall be rated between 1 (dripping water) and 4 (splashing water) while in some embodiments the liquid-tight seal shall be rated between 2 (dripping water with device tilted at 15 degrees) and 5 (water jet). In various embodiments the liquid-tight seal shall be rated between 3 (spraying water) and 6 (powerful water jets) while in some embodiments the liquid-tight seal shall be rated between 4 (splashing water) and 7 (immersion up to 1 meter). In various embodiments the liquid-tight seal shall be rated between 5 (water jets) and 8 (immersion beyond 1 meter) while in some embodiments liquid-tight shall mean the seal will protect the electronic device against liquid ingress up to 100 feet for 30 minutes.

Figure 10:
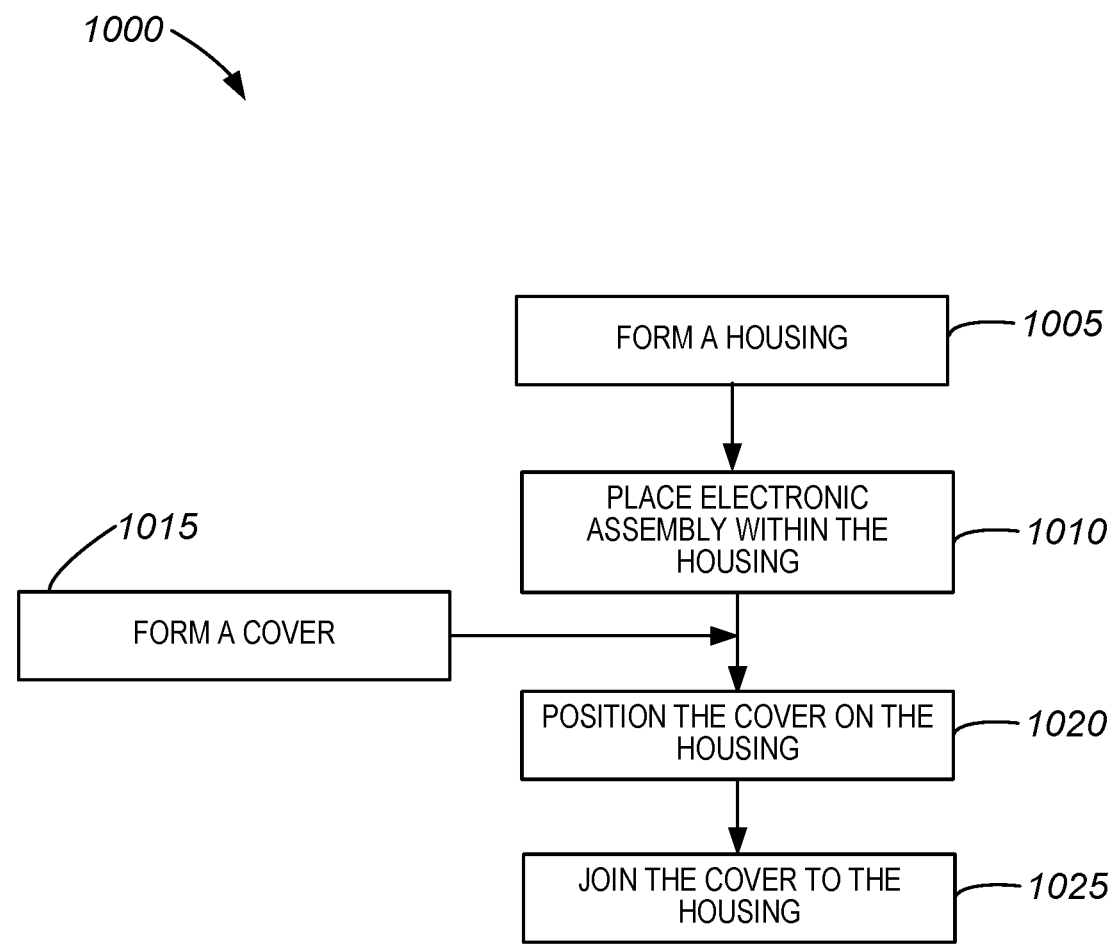
FIG. 10 is a flowchart depicting a process for forming an enclosure according to some embodiments of the disclosure.

FIG. 10 illustrates a method 1000 for making an enclosure such as enclosure 105 in FIG. 1-9 or 900 in FIG. 9. In step 1005 a housing is formed. In one embodiment the housing can have a rear wall and one or more sidewalls that extend from the rear wall to form a cavity. In step 1010, an electronic assembly is placed within the cavity. In step 1015 a cover is formed. The cover can be formed prior to, simultaneously with or after the housing is formed in step 1005. In one embodiment the cover includes a top wall and one or more outer walls extending from the top wall to form a chamber with an opening positioned opposite the top wall. In step 1020 the cover is positioned on the housing such that tongue of the housing is aligned with a groove on the cover. In step 1025 ultrasonic welding is performed between the cover and the housing, joining them together as one enclosure. The weld joint can be a double shear weld joint formed between the tongue and the groove, as describe in detail above. All weld flash is contained within the enclosure so no flash is visible on an exterior surface of the enclosure as described above.

As discussed above, embodiments of the disclosure are suitable for use with a myriad electronic devices. For example, any device that receives or transmits audio, video or data signals can be used with embodiments of the disclosure. In some instances, embodiments of the disclosure are particularly well suited for use with portable electronic media devices because of their potentially small form factor and need for aesthetically appealing enclosures.

As used herein, an electronic media device includes any device with at least one electronic component that can be used to present human-perceivable media. Such devices can include, for example, portable music players (e.g., MP3 devices and Apple's iPod devices), portable video players (e.g., portable DVD players), cellular telephones (e.g., smart telephones such as Apple's iPhone devices), video cameras, digital still cameras, projection systems (e.g., holographic projection systems), gaming systems, PDAs, as well as tablet (e.g., Apple's iPad devices), laptop or other mobile computers. Some of these devices can be configured to provide audio, video or other data or sensory output.

For simplicity, various internal components, such as the AC/DC converter circuitry, power transfer circuitry, internal connectors and other components of electronic devices 100 and 900 (see FIGS. 1 and 9) are not shown in the figures.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. An enclosure for an electronic device comprising:
   a housing including a bottom wall and at least one sidewall extending from the bottom wall to define a cavity, the at least one sidewall having a distal end region;
   a tongue forming a portion of the distal end region and including a plurality of segments distributed along a length of the tongue with adjacent segments of the plurality of segments separated by a gap;
   a cover attached to the distal end region of the housing, the cover including a pair of parallel walls positioned along a perimeter region of the cover, the pair of parallel walls defining a groove therebetween, wherein the tongue is aligned with and positioned within the groove; and
   a plurality of supports disposed within the groove and extending between the pair of parallel walls, wherein each of the plurality of supports is aligned with a corresponding gap.

2. The enclosure of claim 1 wherein the tongue is welded to the pair of parallel walls, forming a double shear weld joint.

3. The enclosure of claim 1 further comprising a plurality of electrical prongs extending from the cover and configured to mate with a corresponding receptacle connector.

4. The enclosure of claim 3 further comprising an electronic assembly positioned within the cavity.

5. The enclosure of claim 4 wherein the electronic assembly is an AC to DC converter that converts AC power received from the corresponding receptacle connector to DC power that is supplied to an external electronic device.

6. The enclosure of claim 5 further comprising a receiving opening formed in the enclosure that enables the external electronic device to be electrically coupled to the electronic assembly.

7. The enclosure of claim 1 further comprising a peripheral wall forming a portion of the distal end region, wherein the peripheral wall is parallel to and spaced apart from the tongue.

8. A plastic assembly comprising:
   a first plastic component including at least one wall having a distal end region;
   a tongue forming a portion of the distal end region, the tongue including a plurality of segments distributed along a length of the tongue with adjacent segments of the plurality of segments separated by a gap;
   a second plastic component attached to the distal end region of the first plastic component, the second plastic component including a pair of parallel walls defining a groove between the pair of parallel walls, wherein the tongue is aligned with and positioned within the groove; and
   a plurality of supports disposed within the groove and extending between the pair of parallel walls, wherein each of the plurality of supports is aligned with a corresponding gap.

9. The plastic assembly of claim 8 wherein the first plastic component includes a bottom wall and the at least one wall extends from the bottom wall to define a cavity.

10. The plastic assembly of claim 9 further comprising an electronic assembly positioned within the cavity.

11. The plastic assembly of claim 10 wherein the electronic assembly is an AC to DC converter that converts AC power received from a corresponding receptacle connector to DC power that is supplied to an external electronic device.

12. The plastic assembly of claim 11 further comprising a receiving opening positioned at an exterior surface that enables a connector of the external electronic device to be electrically coupled to the electronic assembly.

13. The plastic assembly of claim 8 wherein the second plastic component is a cover and the pair of parallel walls are positioned along a perimeter region of the cover.

14. The plastic assembly of claim 8 further comprising a plurality of electrical prongs extending from the second plastic component and configured to mate with a corresponding receptacle connector.

15. The plastic assembly of claim 8 wherein the tongue is welded to the pair of parallel walls, forming a double shear weld joint.

16. A method of forming an electronic device, the method comprising:
   forming a housing including a bottom wall and at least one sidewall extending from the bottom wall to define a cavity, the at least one sidewall having a tongue that forms a portion of a distal end region of the at least one sidewall, wherein the tongue includes a plurality of segments distributed along a length of the tongue with adjacent segments of the plurality of segments separated by a gap;
   disposing an electronic assembly within the cavity;
   forming a cover including a pair of parallel walls positioned along a perimeter region of the cover, the pair of parallel walls defining a groove therebetween, the cover further including a plurality of supports disposed within the groove and extending between the pair of parallel walls;
   aligning the cover at the distal end region of the housing such that the tongue is aligned with and positioned within the groove and each of the plurality of supports is aligned with a corresponding gap; and
   attaching the tongue to the pair of parallel walls.

17. The method of claim 16 wherein the tongue is attached to the pair of parallel walls with a double shear weld joint.

18. The method of claim 16 wherein the housing includes a receiving opening configured to receive a connector of an external electronic device.

19. The method of claim 18 wherein the electronic assembly is an AC to DC converter that converts AC power received from a wall receptacle to DC power that is supplied to the external electronic device through the connector.

20. The method of claim 16 wherein the electronic device includes a plurality of electrical prongs extending from an exterior surface of the cover.

* * * * *